United States Patent
Tsubaki et al.

(10) Patent No.: US 11,990,356 B2
(45) Date of Patent: May 21, 2024

(54) STORAGE SHELF

(71) Applicant: MURATA MACHINERY, LTD., Kyoto (JP)

(72) Inventors: Tatsuo Tsubaki, Ise (JP); Shinji Onishi, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 748 days.

(21) Appl. No.: 16/973,448

(22) PCT Filed: Mar. 22, 2019

(86) PCT No.: PCT/JP2019/012222
§ 371 (c)(1),
(2) Date: Dec. 9, 2020

(87) PCT Pub. No.: WO2019/239672
PCT Pub. Date: Dec. 19, 2019

(65) Prior Publication Data
US 2021/0257239 A1     Aug. 19, 2021

(30) Foreign Application Priority Data

Jun. 15, 2018   (JP) ................ 2018-114816

(51) Int. Cl.
*H01L 21/673* (2006.01)
*B65G 1/14* (2006.01)
*H01L 21/677* (2006.01)

(52) U.S. Cl.
CPC .......... *H01L 21/67393* (2013.01); *B65G 1/14* (2013.01); *H01L 21/67769* (2013.01); *B65G 2201/0297* (2013.01)

(58) Field of Classification Search
CPC ........ H01L 21/67393; H01L 21/67769; B65G 1/14; B65G 2201/0297
See application file for complete search history.

(56) References Cited

U.S. PATENT DOCUMENTS

| 5,382,127 A | 1/1995 | Garric et al. |
| 6,641,348 B1 * | 11/2003 | Schultz ............ H01L 21/67775 414/217 |

(Continued)

FOREIGN PATENT DOCUMENTS

| JP | 2010-182747 A | 8/2010 |
| JP | 2015-126203 | 7/2015 |

(Continued)

OTHER PUBLICATIONS

Official Communication issued in International Patent Application No. PCT/JP2019/012222, mailed on Jun. 18, 2019.

*Primary Examiner* — Saul Rodriguez
*Assistant Examiner* — Ashley K Romano
(74) *Attorney, Agent, or Firm* — Keating & Bennett, LLP (57) ABSTRACT

A storage shelf includes a body frame and a shelf plate attached to the body frame with an elastic body therebetween, the storage shelf storing thereon a FOUP including a contained object. The storage shelf includes a feed nozzle on the shelf plate to feed gas to the FOUP, and a feed tube with one end communicating with the feed nozzle and the other end communicating with a main tube connected to a feed source of the gas to be fed to the FOUP, the main tube being supported by the body frame. The feed tube has a flexible portion having flexibility at least partially between the one end and the other end.

6 Claims, 6 Drawing Sheets

(56) References Cited

U.S. PATENT DOCUMENTS

| | | | |
|---|---|---|---|
| 7,930,061 B2* | 4/2011 | Rice | H01L 21/67724 |
| | | | 414/217 |
| 10,325,797 B2* | 6/2019 | Iwasaki | H01L 21/67389 |
| 10,332,766 B2* | 6/2019 | Sasaki | H01L 21/67757 |
| 11,367,642 B2* | 6/2022 | Kinoshita | F27D 3/0084 |
| 2014/0017040 A1 | 1/2014 | Takahara et al. | |
| 2016/0001976 A1 | 1/2016 | Nagamine | |
| 2016/0137413 A1 | 5/2016 | Nagamine | |
| 2017/0278736 A1 | 9/2017 | Iwasaki | |
| 2018/0229277 A1 | 8/2018 | Onishi | |

FOREIGN PATENT DOCUMENTS

| | | |
|---|---|---|
| JP | 2016-141565 A | 8/2016 |
| JP | 6061020 B2 | 1/2017 |
| KR | 10-2013-0080455 A | 7/2013 |
| KR | 10-2017-0058393 A | 5/2017 |

* cited by examiner

STORAGE SHELF

BACKGROUND OF THE INVENTION

1. Field of the Invention

The present invention relates to a storage shelf.

2. Description of the Related Art

Examples of known storage shelves configured to store thereon containers include a front-opening unified pod (FOUP) configured to accommodate wafers to be processed in a semiconductor manufacturing device or a liquid crystal manufacturing device, for example, and a reticle pod configured to accommodate reticles to be used in the semiconductor manufacturing device or the liquid crystal manufacturing device. Such a storage shelf is installed in a manner suspended from a supported member of a track for overhead transport vehicles or a ceiling, for example, or is installed in a manner standing on the ground. The storage shelf thus installed may be subjected to vibrations transmitted during travel of aerial transportation or ground transportation. For example, Japanese Patent No. 6061020 discloses a storage shelf including a shelf plate (placement unit) on which a container is placed and a body frame (frame unit) supporting the shelf plate, in which the shelf plate is supported by the body frame with elastic bodies interposed therebetween. This storage shelf is capable of reducing influence of vibrations transmitted to the shelf plate.

In order to maintain cleanliness of contained objects, it may be desired for above-described storage shelf may to be provided with a purging apparatus configured to feed purge gas such as inert gas or clean dry air to the container. However, when the shelf plate is provided with the purging apparatus, vibration isolation for the shelf plate may be hindered by a feed tube through which the purge gas is fed to the container, and vibrations may be transmitted to the shelf plate via the feed tube.

SUMMARY OF THE INVENTION

Preferred embodiments of the present invention provide storage shelves that are each able to reduce or prevent vibrations from being transmitted to containers even when shelf plates are provided with purging apparatuses.

A storage shelf according to a preferred embodiment of the present invention is a storage shelf including a body frame and a shelf plate with a plate shape, the body frame including a base with a plate shape, the shelf plate being attached to the base with an elastic body provided therebetween, the storage shelf storing thereon a container including a contained object. The storage shelf also includes a feed nozzle provided on the shelf plate to feed gas to the container, and a feed tube including a first end communicating with the feed nozzle and a second end communicating with a main tube connected to a feed source of the gas to be fed to the container, the main tube being supported by a support separate from the shelf plate. The feed tube includes a flexible portion having flexibility at least partially between the first end and the second end, and is provided in a space between the base and the shelf plate.

In the storage shelf described above, at least a portion, along the entire length, of the feed tube connected to the feed nozzle provided on the shelf plate has flexibility. Thus, the feed tube is able to provide relative movement between the shelf plate and the body frame, and vibration isolation for the shelf plate is reduced or prevented from being hindered and vibrations are reduced or prevented from being transmitted to the shelf plate via the feed tube. Accordingly, even when the shelf plate is provided with a purging apparatus, vibrations are able to be reduced or prevented from being transmitted to the container.

In a storage shelf according to a preferred embodiment of the present invention, the support may include the body frame. Accordingly, even in the storage shelf with the main tube fixed to the body frame, vibrations are able to be reduced or prevented from being transmitted to the container.

In a storage shelf according to a preferred embodiment of the present invention, the shelf plate may have a rectangular or substantially rectangular shape in plan view, the feed nozzle may be located at one corner portion of the shelf plate, and the second end of the feed tube may be located at another corner portion of the shelf plate that is diagonally opposite to the one corner portion. Accordingly, the positions of the first end and the second end are shifted from each other in both of a first direction parallel or substantially parallel to one side of the shelf plate and a second direction parallel or substantially parallel to a side orthogonal to the one side, and thus relative movements between the body frame and the shelf plate in the first direction and the second direction are able to be provided.

In a storage shelf according to a preferred embodiment of the present invention, an axial direction of the feed tube at the first end and an axial direction thereof at the second end may be orthogonal or substantially orthogonal to each other, and the feed tube may include a curved portion between the first end and the second end. Accordingly, the feed tube is able to further provide both movements in the first direction and the second direction in the shelf plate.

In a storage shelf according to a preferred embodiment of the present invention, the feed tube may be located along a horizontal direction, and may have the curved portion. Accordingly, even when the space between the body frame and the shelf plate located above the body frame with the elastic body provided therebetween is relatively narrow, the feed tube is able to be located between the body frame and the shelf plate. In other words, a size of the storage shelf in the vertical direction is able to be reduced or minimized.

A storage shelf according to a preferred embodiment of the present invention may further include a filter supported by the body frame and provided between the main tube and the second end of the feed tube. Accordingly, gas is able to be cleaned at a final end where the gas is fed to the feed tube, and thus higher quality gas is able to be fed to the container.

According to a preferred embodiment of the present invention, even when the shelf plate is provided with the purging apparatus, vibrations are able to be prevented from being transmitted to the container.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 2:
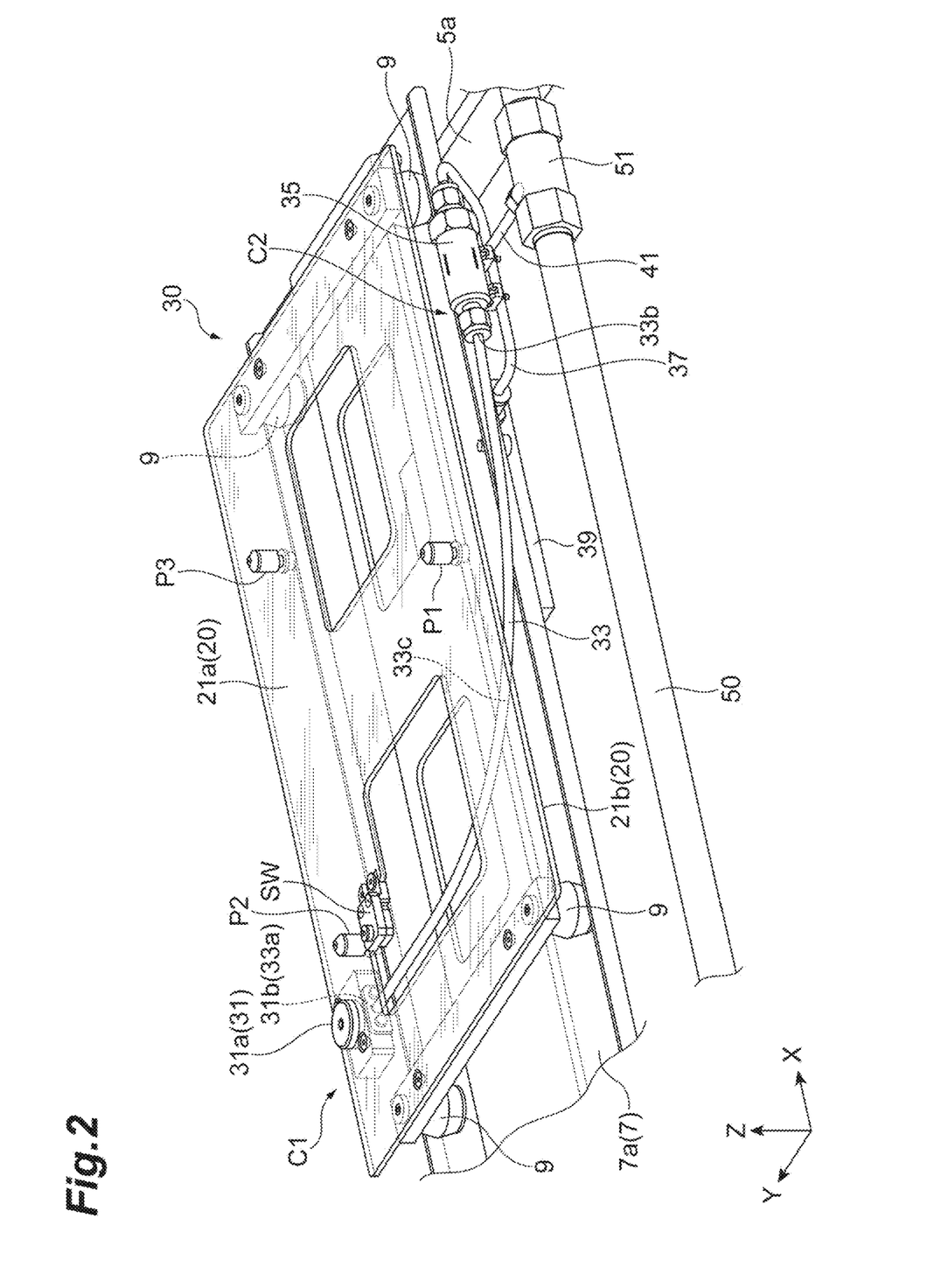
FIG. 2 is a perspective view illustrating a shelf plate when viewed from obliquely above.
Figure 3:
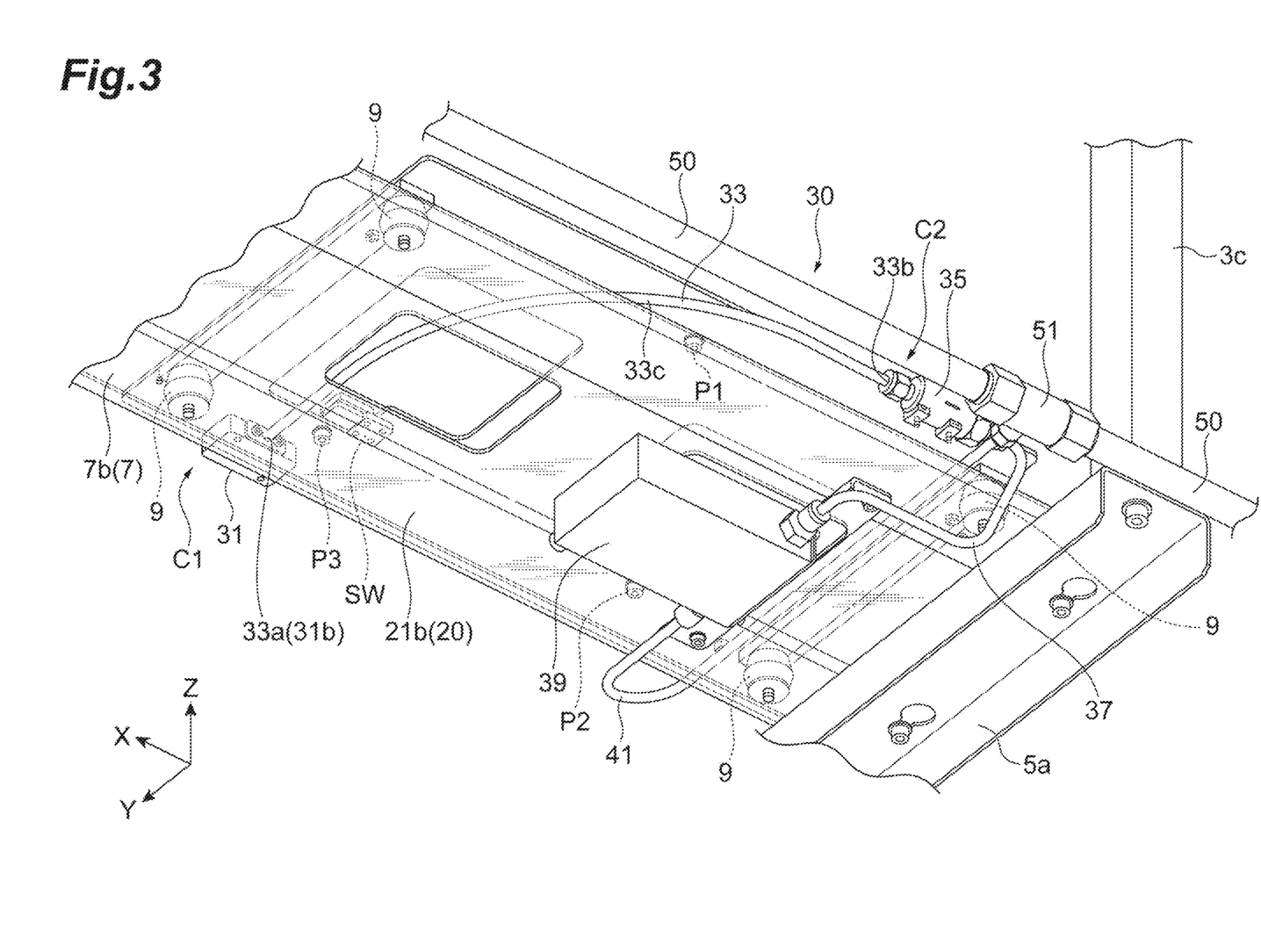
FIG. 3 is a perspective view illustrating the shelf plate when viewed from obliquely below.
Figure 4:
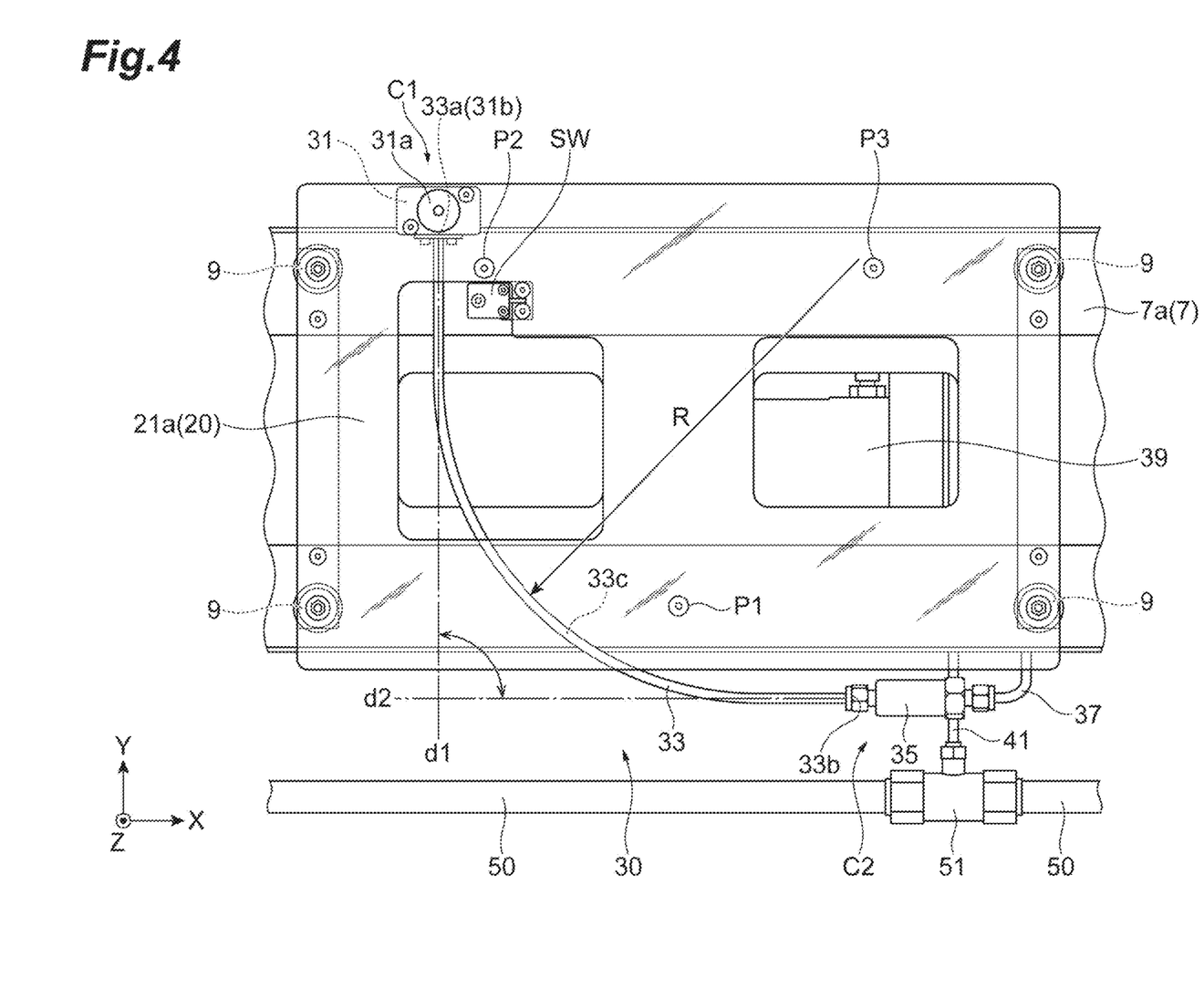
FIG. 4 is a plan view illustrating the shelf plate when viewed from above.

Preferred embodiments of the present invention and modifications thereof will now be described in detail with reference to the drawings. In the description of the drawings, like elements are designated by like reference signs, and duplicate description is omitted. The terms "X-direction", "Y-direction", and "Z-direction" are based on directions illustrated in the drawings and are given for convenience. In FIG. 2 and FIG. 4, a shelf plate 20 is illustrated in a transparent manner. In FIG. 3, a base 7 is illustrated in a transparent manner.

Figure 1:
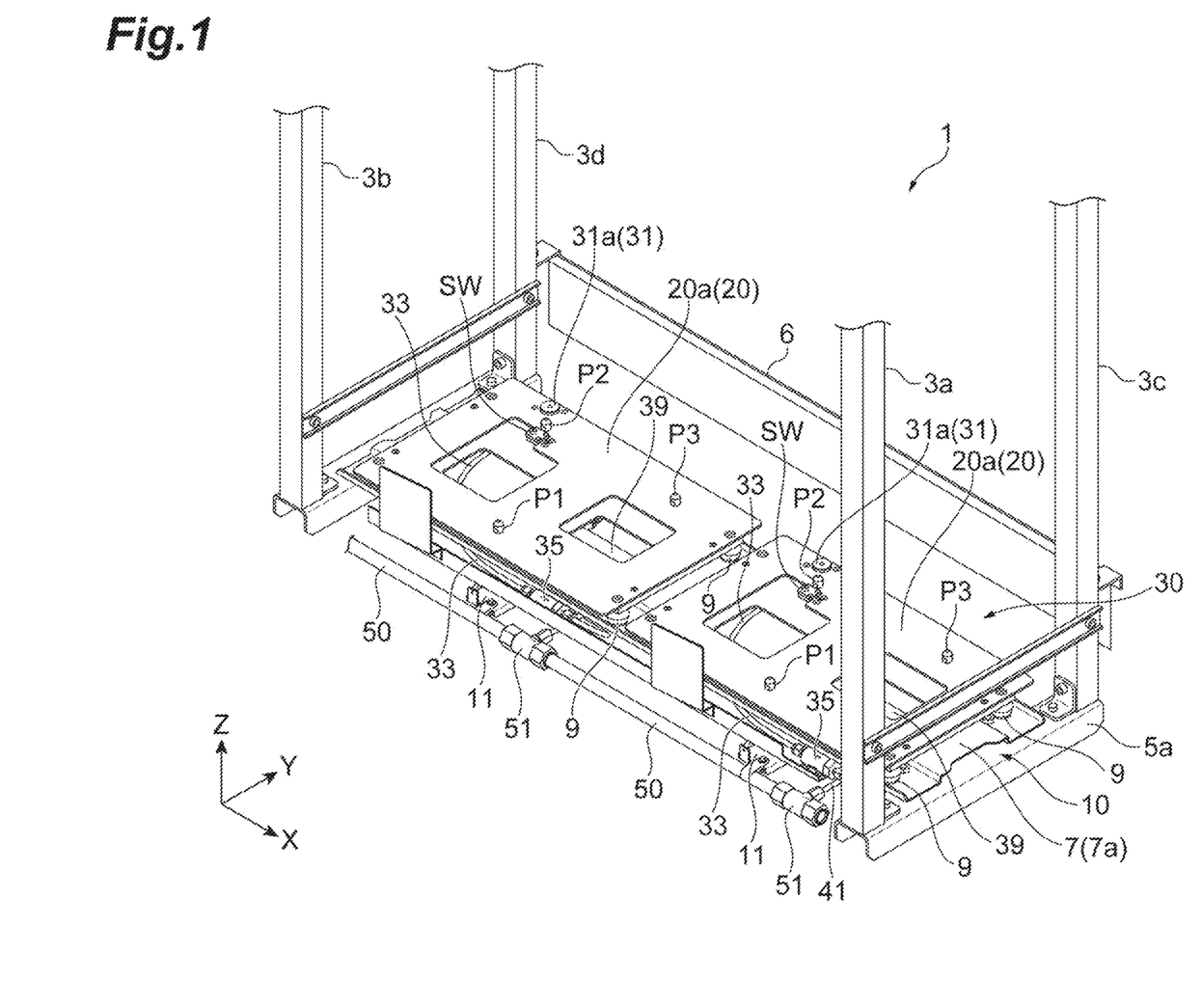
FIG. 1 is a perspective view illustrating a storage shelf according to a preferred embodiment of the present invention.

A storage shelf 1 illustrated in FIG. 1 may be installed in a semiconductor conveyance system of a semiconductor manufacturing plant, for example. The storage shelf 1 temporarily stores thereon a container (contained object), for example, a reticle pod or a FOUP (not illustrated). The storage shelf 1 includes a body frame 10, shelf plates 20, main tubes 50, and purging apparatuses 30. The body frame 10 supports the shelf plates 20 with elastic bodies 9 provided therebetween. Examples of the elastic bodies 9 include rubber materials, silicone gel materials, urethan gels, and metal springs. The body frame 10 includes suspending structures 3a to 3d, connectors 5a, 5b, and a base 7.

The suspending structures 3a to 3d are pillars extending in the vertical direction (Z-direction), and a plurality of the suspending structures 3a to 3d are provided (for example, four in the present preferred embodiment). The suspending structures 3a to 3d face each other spaced at predetermined intervals in the X-direction and the Y-direction. The suspending structures 3a to 3d are secured to any one of a rail of an overhead transport vehicle, a support supporting this rail, and a ceiling. On lower-end sides of the suspending structures 3a, 3b, a fence 6 extending in the X-direction is laterally provided. On lower-end sides of the suspending structures 3c, 3d, a fence 6 extending in the X-direction is laterally provided. The fences 6, 6 prevent a FOUP from falling. In FIG. 1, for convenience in description, illustration of one of the fences laterally provided on the suspending structures 3a, 3b is omitted.

The connector 5a is a structure extending in the Y-direction, and connects the lower ends of the suspending structure 3a and the suspending structure 3c. The connector 5b is a structure extending in the Y-direction, and connects the lower ends of the suspending structure 3b and the suspending structure 3d. The base 7 is a structure with a plate shape extending in the X-direction, and is provided across the connectors 5a, 5b.

Each shelf plate 20 is a structure having a rectangular or substantially rectangular plate shape in plan view when viewed from the Z-direction, and a FOUP is placed thereon. The shelf plates 20 are supported by the elastic bodies 9 located on an upper surface 7a of the base 7. Each shelf plate 20 includes a placement surface 21a on which a FOUP is placed and a lower surface 21b that is opposite to the placement surface 21a (see FIG. 2). The shelf plate 20 is provided with pins P1, P2, P3 and a feed nozzle 31. The pins P1 to P3 protrude upward from the placement surface 21a of the shelf plate 20. The pins P1 to P3 are located at positions corresponding to positioning holes (not illustrated) provided in a bottom portion of the FOUP. On the placement surface 21a of the shelf plate 20, a load sensor SW is provided.

The main tubes 50 are connected to a feed source of gas to be fed to the purging apparatuses 30. Examples of the gas to be fed to the purging apparatuses 30 include nitrogen gas and dry air. Each main tube 50 is a tubular structure including metal, for example, stainless steel or resin, for example, a fluorocarbon polymer. The main tube 50 is supported by a pipe support bracket 11 fixed to the base 7. The main tube 50 includes a branch portion 51. To the branch portion 51, a second pipe 41 included in the corresponding purging apparatus 30 is connected.

As illustrated in FIG. 2 to FIG. 4, the purging apparatus 30 includes the feed nozzle 31, a feed tube 33, a filter 35, a first pipe 37, a mass flow controller (MFC) 39, and the second pipe 41. The feed nozzle 31 is a nozzle to feed gas into a FOUP, and has a nozzle portion 31a from which the gas is fed to the FOUP and a connecting portion 31b to which the feed tube 33 is connected. The nozzle portion 31a protrudes upward from the placement surface 21a of the shelf plate 20, and is connected to an introduction hole provided in the bottom surface of the FOUP by placing the FOUP onto the nozzle portion 31a. The connecting portion 31b is provided on the lower surface 21b of the shelf plate 20. The feed nozzle 31 is located at one corner portion C1 of the shelf plate 20.

The feed tube 33 includes a first end 33a communicating with the feed nozzle 31 and a second end 33b communicating with the main tube 50 that is supported by the base (a support separate from the shelf plate 20) 7 and is connected to the feed source of gas to be fed to a FOUP. In the present preferred embodiment, the second end 33b communicates with the main tube 50 via the filter 35, the first pipe 37, the MFC 39, and the second pipe 41. The feed tube 33 is, for example, a tubular structure including resin such as a fluorocarbon polymer, and has flexibility all along its entire length. The feed tube 33 is able to maintain a state of extending in the horizontal direction between the first end 33a and the second end 33b without being supported by the support.

The axial direction d1 of the feed tube 33 at the first end 33a and the axial direction d2 thereof at the second end 33b are orthogonal or substantially orthogonal to each other, and the feed tube 33 also includes a curved portion 33c between the first end 33a and the second end 33b. This curved portion 33c is a flexible portion of the feed tube 33. The radius R of the curved portion 33c is about 200 millimeters to about 250 millimeters, for example. The feed tube 33 having flexibility is bent and the above-described radius R is able to be set to a radius of curvature as large as possible in a state in which the first end 33a is connected to the feed nozzle 31 and the second end 33b is connected to the filter 35.

The filter 35 is a structure in which a filter to remove foreign matters included in gas passing through the filter 35 is provided, and removes foreign matters included in gas fed from the feed source of the gas via the main tube 50. The second end 33b of the feed tube 33 is connected to the filter 35. The filter 35 is fixed to the base 7 by an appropriate component, element, or structure. The filter 35 is located at another corner portion C2 of the shelf plate 20 that is diagonally opposite to the one corner portion C1.

The first pipe 37 is a tubular structure connecting the filter 35 to the MFC 39. The first pipe 37 is a tubular structure including metal, for example, stainless steel. The first pipe 37 is not supported by anything other than connecting portions to the filter 35 and the MFC 39.

The MFC 39 is an instrument to measure the flow rate of gas fed from the main tube 50 and controlling the flow rate. The MFC 39 is controlled by a controller (not illustrated). If a FOUP has been detected by the load sensor SW provided on the shelf plate 20, the controller controls the MFC 39 to feed a predetermined flow rate of gas the FOUP. If a FOUP has not been detected by the load sensor SW provided on the shelf plate 20, the controller controls the MFC 39 not to feed the gas to the FOUP. The MFC 39 may be fixed to a lower surface 7b of the base 7 by an appropriate method or structure.

The second pipe 41 is a tubular structure connecting the MFC 39 to the branch portion 51. The second pipe 41 is a tubular structure including metal, for example, stainless steel or resin, for example, a fluorocarbon polymer.

In the storage shelf 1 according to the preferred embodiment described above, the feed tube 33 connected to the feed nozzle 31 provided on the shelf plate 20 deforms. Thus, the feed tube 33 is able to provide relative movement between the shelf plate 20 and the body frame 10 (movements in the X-direction, the Y-direction, and the Z-direction), and vibration isolation for the shelf plate 20 is reduced or prevented from being hindered and vibrations are reduced or prevented from being transmitted to the shelf plate 20 via the feed tube 33. Accordingly, even when the shelf plate 20 is provided with the purging apparatus 30, vibrations are able to be reduced or prevented from being transmitted to the FOUP.

In the storage shelf 1 according to the preferred embodiment, even in the storage shelf 1 with the main tube 50 fixed to the body frame 10, vibrations are able to be reduced or prevented from being transmitted to the FOUP.

In the storage shelf 1 according to the present preferred embodiment, the positions of the first end 33a and the second end 33b of the feed tube 33 are shifted from each other in both of the X-direction parallel or substantially parallel to one side of the shelf plate 20 and the Y-direction parallel or substantially parallel to a side orthogonal to the one side. Thus, the feed tube 33 is able to provide relative movements between the base 7 and the shelf plate 20 in the X-direction and the Y-direction.

In the storage shelf 1 according to the present preferred embodiment, the axial direction d1 of the feed tube 33 at the first end 33a and the axial direction d2 thereof at the second end 33b are orthogonal or substantially orthogonal to each other, and the feed tube 33 includes the curved portion 33c between the first end 33a and the second end 33b. Accordingly, the feed tube 33 is able to further provide both movements (deformations) in the X-direction and the Y-direction in the shelf plate 20.

In the storage shelf 1 according to the present preferred embodiment, the feed tube 33 includes the curved portion 33c located along the horizontal direction (XY-plane). Accordingly, even when the space between the base 7 and the shelf plate 20 located above the base 7 with the elastic bodies 9 provided therebetween is relatively narrow, the feed tube 33 is able to be located between the base 7 and the shelf plate 20. Accordingly, a size of the storage shelf 1 in the vertical direction is able to be reduced. Furthermore, the capacity to store FOUPs per unit area is able to be significantly increased.

Because the storage shelf 1 according to the present preferred embodiment includes the filter 35 supported by the base 7 and provided between the main tube 50 and the second end 33b of the feed tube 33, gas is able to be cleaned at a final end where the gas is fed to the feed tube 33 (at the second end 33b of the feed tube 33). Thus, higher quality gas is able to be fed to the FOUP.

Although preferred embodiments have been described above, the present invention is not limited to the preferred embodiments, and various modifications may be made within the scope not departing from the gist of the present invention.

Figure 5:
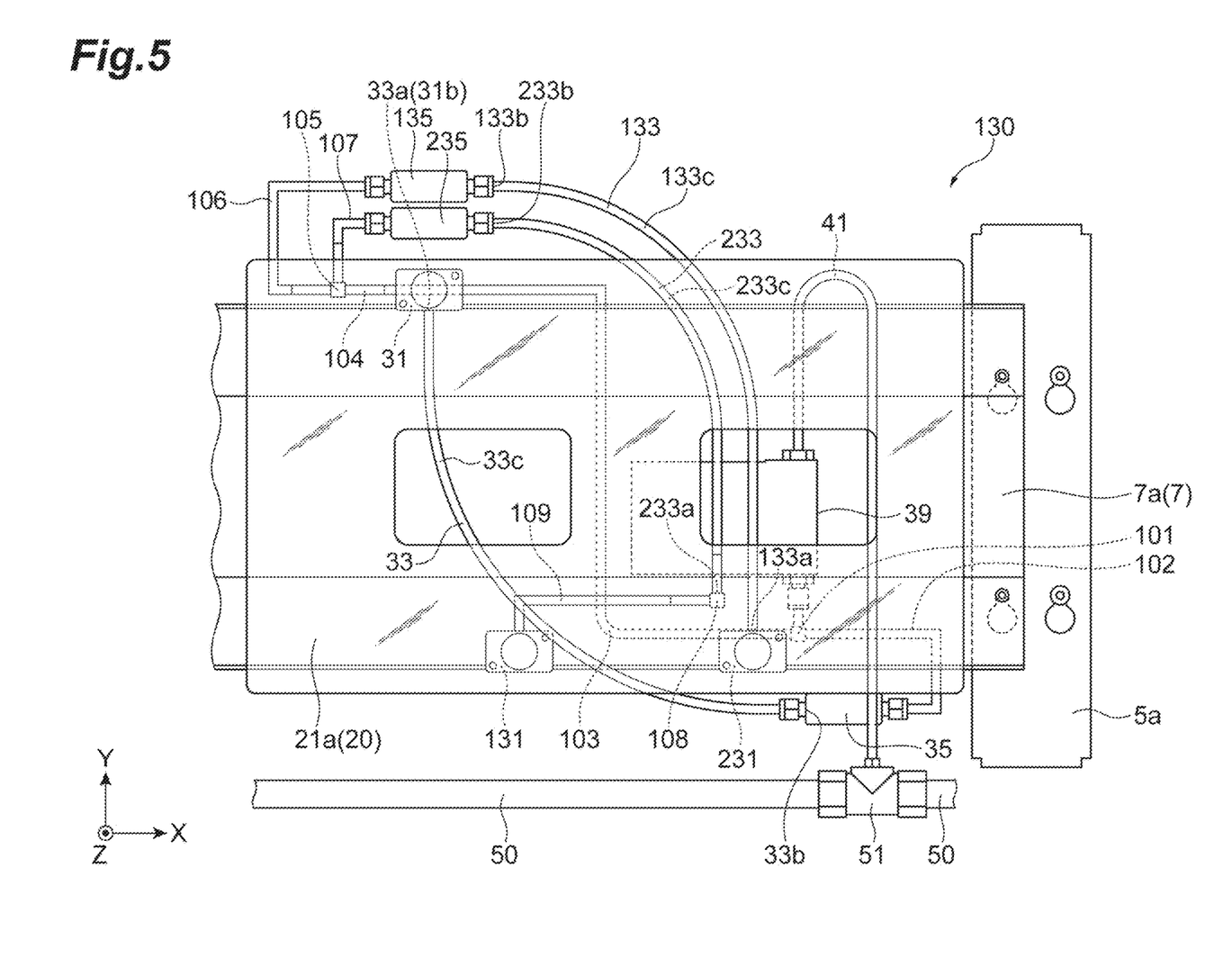
FIG. 5 is a plan view of a shelf plate according to a first modification of a preferred embodiment of the present invention when viewed from above.

In the preferred embodiments described above, an example has been described in which each shelf plate 20 of the storage shelf 1 is provided with one feed nozzle 31. However, each shelf plate 20 may be provided with a plurality of feed nozzles and a plurality of feed tubes. For example, as illustrated in FIG. 5, each shelf plate 20 of a storage shelf 1 according to a first modification of a preferred embodiment of the present invention may be provided with three feed nozzles 31, 131, 231 and three feed tubes 33, 133, 233 to feed gas to the three feed nozzles 31, 131, 231, respectively. In plan view when viewed from the Z-direction, the three feed tubes 33, 133, 233 do not overlap each other in a planar view.

In a purging apparatus 130 of the storage shelf 1 according to the first modification, a branch portion 101 is provided downstream of the MFC 39, the filter 35 is connected to a first end of the branch portion 101 with a metal tube 102 provided therebetween, and a filter 135 and a filter 235 are each connected to a second end of the branch portion 101 with a metal tube 103, a branch portion 105, a metal tube 106, and a metal tube 107 provided therebetween. The filters 35, 135, 235 may be fixed to the base 7 by an appropriate method or structure.

The first end 33a of the feed tube 33 is connected to the feed nozzle 31, and the second end 33b thereof is connected to the filter 35. A first end 133a of the feed tube 133 is connected to the feed nozzle 131, and a second end 133b thereof is connected to the filter 135. A first end 233a of the feed tube 233 communicates with the feed nozzle 231, and a second end 233b thereof is connected to the filter 235. The first end 233a of the feed tube 233 is connected to the feed nozzle 31 with an elbow joint 108 and a metal tube 109 provided therebetween. The elbow joint 108 is fixed to the shelf plate 20. The feed tubes 33, 133, 233 are flexible tubes including resin.

In the storage shelf 1 according to the first modification, the feed tubes 33, 233 that are respectively connected to the feed nozzles 31, 231 provided on the shelf plate 20 deform. The feed tubes 33, 233 also have curved portions 33c, 233c, respectively. Thus, the feed tubes 33, 233 provide relative movement between the shelf plate 20 and the body frame 10. The metal tube 109 connected to the feed nozzle 231 provided on the shelf plate 20 is connected to the elbow joint 108. The feed tube 233 connected to the elbow joint 108 deforms. The feed tube 233 has the curved portion 233c. With the feed tubes 33, 133, 233 connected as described above, vibration isolation for the shelf plate 20 is prevented from being hindered and vibrations are prevented from being transmitted to the shelf plate 20 via the feed tubes 33, 133, 233. Accordingly, even when the shelf plate 20 is provided with the purging apparatus, vibrations are able to be reduced or prevented from being transmitted to the FOUP.

In the storage shelf 1 according to the first modification, in plan view when viewed from the Z-direction, the three feed tubes 33, 133, 233 do not overlap each other in a planar view, and thus a size of the storage shelf 1 in the Z-direction (vertical direction) is able to be reduced. In the storage shelf 1 according to the first modification, the feed tube 33 including the curved portion 33c and the feed tubes 133, 233 including the curved portion 133c, 233c are opposed to each other and concavely bent. Thus, within a limited space in plan view, the feed tubes 33, 133, 233 are able to be flexibly provided.

Figure 6:
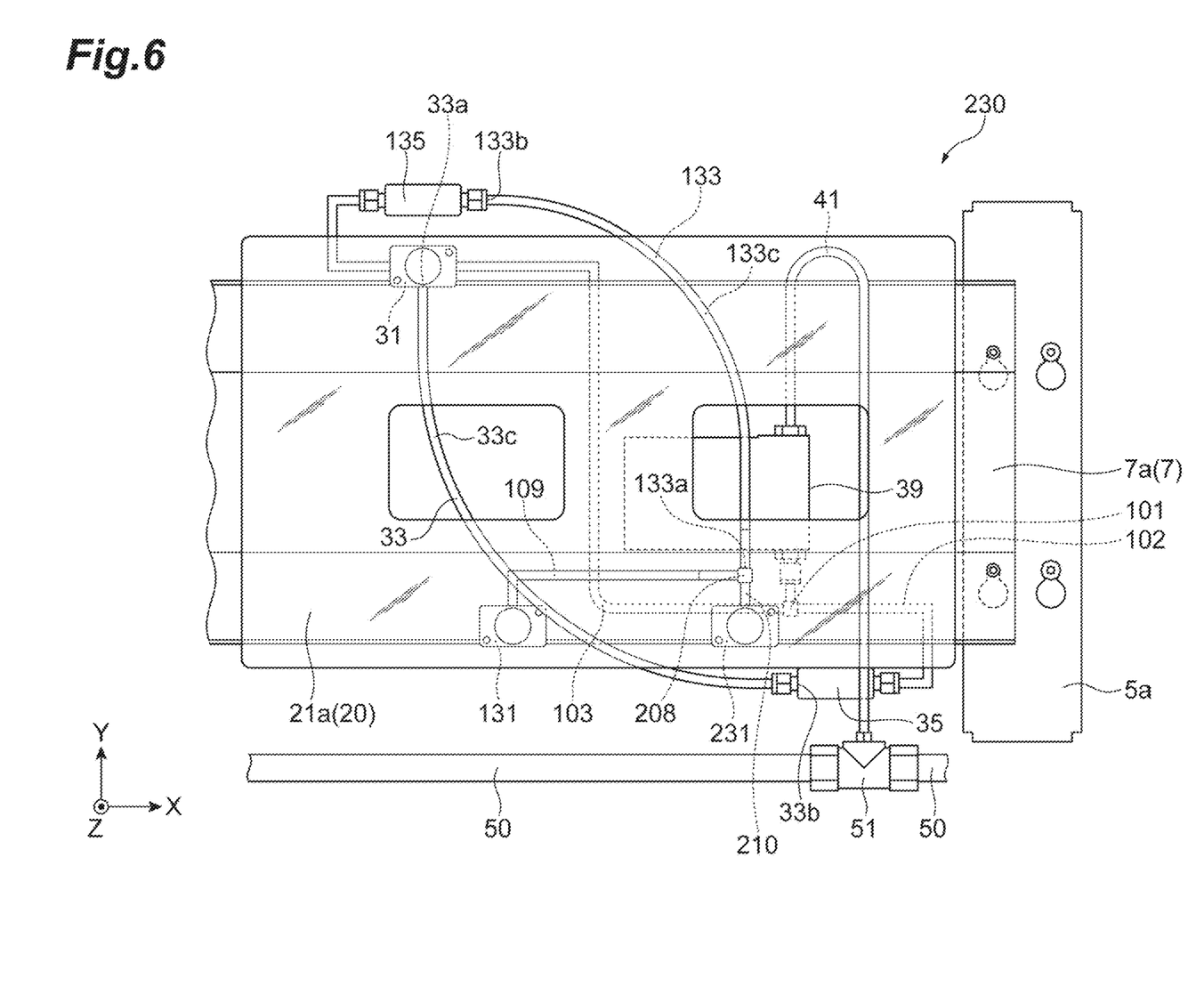
FIG. 6 is a plan view of a shelf plate according to a second modification of a preferred embodiment of the present invention when viewed from above.

In the first modification, an example has been described in which, when the three feed nozzles 31, 131, 231 are provided, the feed tubes 33, 133, 233 having flexibility and respectively connected to the three feed nozzles 31, 131, 231 are provided. However, the present invention is not limited to this specific structure. For example, as illustrated in FIG. 6, each shelf plate 20 of a storage shelf 1 according to a second modification of a preferred embodiment of the present invention may be provided with the three feed nozzles 31, 131, 231, the feed tube 33 to feed gas to the feed nozzle 31, and the feed tube 133 to feed gas to the two feed nozzles 131, 231. In plan view when viewed from the Z-direction, the two feed tubes 33, 133 do not overlap each other in a planar view.

In a purging apparatus 230 according to the second modification, the branch portion 101 is provided downward of the MFC 39, the filter 35 is connected to a first end of the branch portion 101 with the metal tube 102 provided therebetween, and the filter 135 is connected to the a second end of the branch portion 101 with the metal tube 103 provided therebetween. The filters 35, 135 may be fixed to the base 7 by an appropriate method or structure.

The first end 33a of the feed tube 33 is connected to the feed nozzle 31, and the second end 33b thereof is connected to the filter 35. The first end 133a of the feed tube 133 communicates with each of the feed nozzles 131, 231, and the second end 133b thereof is connected to the filter 135. The first end 133a of the feed tube 133 is connected to a branch portion 208 fixed to the shelf plate 20. A first end of the branch portion 208 is connected to the feed nozzle 131 with a metal tube 210 provided therebetween, and a second end of the branch portion 208 is connected to the feed nozzle 231 with a metal tube 209 provided therebetween. The feed tubes 33, 133 are flexible tubes including resin.

In the storage shelf 1 according to the second modification, the feed tube 33 connected to the feed nozzle 31 provided on the shelf plate 20 deforms. The feed tube 33 has the curved portion 33c. Thus, the feed tube 33 provides relative movement between the shelf plate 20 and the body frame 10. The metal tubes 209, 210 that are respectively connected to the feed nozzles 131, 231 provided on the shelf plate 20 are connected to the branch portion 208. The feed tube 133 connected to the branch portion 208 deforms. The feed tube 133 has the curved portion 133c. With the feed tubes 33, 133 connected as described above, vibration isolation for the shelf plate 20 is able to be reduced or prevented from being hindered and vibrations are able to be reduced or prevented from being transmitted to the shelf plate 20 via the feed tubes 33, 133. Accordingly, even when the shelf plate 20 is provided with the purging apparatus, vibrations are able to be reduced or prevented from being transmitted to the FOUP.

In the storage shelf 1 according to the second modification, in plan view when viewed from the Z-direction, the two feed tubes 33, 133 do not overlap each other in a planar view, and thus a size of the storage shelf 1 in the Z-direction (vertical direction) is able to be reduced. In the storage shelf 1 according to the second modification, the feed tube 33 including the curved portion 33c and the feed tube 133 including the curved portion 133c are opposed to each other and concavely bent. Thus, within a limited space in plan view, the feed tubes 33, 133 are able to be curved.

In the preferred embodiments and modifications thereof, examples have been described in which the first end 33a of the feed tube 33 is directly connected to the connecting portion 31b of the feed nozzle 31. However, the first end 33a may be connected to the connecting portion 31b with an elbow joint bendable at any angle (e.g., 90 degrees) provided therebetween. These features are able to be applied even to a structure in which the feed tube 33 having flexibility is not able to fit.

In the preferred embodiments and the modifications, examples have been described in which the filter 35 is located at the second end 33b of the feed tube 33, that is, the feed tube 33 is provided between the filter 35 and the feed nozzle 31. However, the present invention is not limited to this specific structure. For example, the filter 35 may be located at the first end 33a of the feed tube 33, that is, the filter 35 may be provided between the feed tube 33 and the feed nozzle 31.

In the preferred embodiments and the modifications, examples have been described in which the feed tubes 33, 133, 233 are bent in a horizontal plane. However, for example, the feed tubes 33, 133, 233 may be bent in a vertical plane. In other words, the feed tubes 33, 133, 233 may hang downward.

In the preferred embodiments and the modifications, examples have been described in which the main tube 50 is supported by the pipe support bracket 11 fixed to the base 7. However, for example, the main tube 50 may be supported by a traveling rail along which overhead transport vehicles travel, may be supported by a support installed to a ceiling or the like of a clean room, for example, or may be supported directly by the ceiling.

In the preferred embodiments and the modifications, examples have been described in which the storage shelf 1 is suspended from the ceiling. However, the storage shelf 1 may be installed on a floor. Specifically, the body frame 10 may be installed to stand on the floor.

In the preferred embodiments and the modifications, examples have been described in which the feed tubes 33, 133, 233 have flexibility all along their entire lengths. However, the feed tubes 33, 133, 233 may have flexibility only partially along the entire lengths. Instead of the feed tubes 33, 133, 233 including resin, for example, accordion tubes including resin or metal may be used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A storage shelf comprising:
   a body frame including a base with a plate shape;
   a first shelf plate with a plate shape, the first shelf plate being attached to the base with a first elastic body provided therebetween, and the first shelf plate to store thereon a first container including a first contained object;
   a second shelf plate with a plate shape, the second shelf plate being attached to the base with a second elastic body provided therebetween, and the second shelf plate to store thereon a second container including a second contained object;
   a first feed nozzle provided on the first shelf plate to feed gas to the first container;

a second feed nozzle provided on the second shelf plate to feed gas to the second container;
a first feed tube including a first end communicating with the first feed nozzle and a second end communicating with a main tube connected to a feed source of the gas to be fed to the first container, the main tube being supported by a support separate from the first shelf plate; and
a second feed tube including a first end communicating with the second feed nozzle and a second end communicating with the main tube connected to the feed source of the gas to be fed to the second container, the main tube being supported by the support separate from the second shelf plate; wherein
the first feed tube includes a first flexible portion having flexibility at least partially between the first end of the first feed tube and the second end of the first feed tube, and the first feed tube is provided in a first space between an upper surface of the base and a lower surface of the first shelf plate in a vertical direction of the storage shelf;
the second feed tube includes a second flexible portion having flexibility at least partially between the first end of the second feed tube and the second end of the second feed tube, and the second feed tube is provided in a second space between the upper surface of the base and a lower surface of the second shelf plate in the vertical direction of the storage shelf;
the first shelf plate has a rectangular or substantially rectangular shape in a plan view;
the first feed nozzle is located at one corner portion of the first shelf plate;
the second end of the first feed tube is located at another corner portion of the first shelf plate that is diagonally opposed to the one corner portion of the first shelf plate;
the second shelf plate has a rectangular or substantially rectangular shape in the plan view;
the second feed nozzle is located at one corner portion of the second shelf plate; and
the second end of the second feed tube is located at another corner portion of the second shelf plate that is diagonally opposed to the one corner portion of the second shelf plate.

2. The storage shelf according to claim 1, wherein the support includes the body frame.

3. The storage shelf according to claim 1, wherein
an axial direction of the first feed tube at the first end and an axial direction thereof at the second end are orthogonal or substantially orthogonal to each other, and the first feed tube includes a first curved portion between the first end and the second end; and
an axial direction of the second feed tube at the first end and an axial direction thereof at the second end are orthogonal or substantially orthogonal to each other, and the second feed tube includes a second curved portion between the first end and the second end.

4. The storage shelf according to claim 1, wherein
the first feed tube extends along a horizontal direction; and
the second feed tube extends along the horizontal direction.

5. The storage shelf according to claim 1, further comprising:
a first filter supported by the body frame and provided between the main tube and the second end of the first feed tube; and
a second filter supported by the body frame and provided between the main tube and the second end of the second feed tube.

6. The storage shelf according to claim 1, wherein:
the body frame further includes:
a plurality of suspending structures; and
connectors connecting between lower ends of the plurality of suspending structures,
the base is provided across the connectors;
the first shelf plate includes:
the first feed nozzle, and
a first pin to position the first container;
the second shelf plate includes:
the second feed nozzle, and
a second pin to position the second container; and
the main tube is supported by the base.

* * * * *